US010796728B2

(12) United States Patent
Onda (10) Patent No.: US 10,796,728 B2
(45) Date of Patent: Oct. 6, 2020

(54) WIRING WITH EXTERNAL TERMINAL

(71) Applicant: Micron Technology, Inc., Boise, ID (US)

(72) Inventor: Takamitsu Onda, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 183 days.

(21) Appl. No.: 16/104,501

(22) Filed: Aug. 17, 2018

(65) Prior Publication Data

US 2020/0058329 A1 Feb. 20, 2020

(51) Int. Cl.
*G11C 7/22* (2006.01)
*G11C 5/06* (2006.01)
*G11C 11/4093* (2006.01)
*G11C 11/4076* (2006.01)

(52) U.S. Cl.
CPC .......... *G11C 5/063* (2013.01); *G11C 11/4076* (2013.01); *G11C 11/4093* (2013.01)

(58) Field of Classification Search
CPC ......... G11C 7/22; G11C 11/4076; G11C 7/10; G11C 7/222; G11C 11/4093; G11C 11/4096; G11C 29/025; G11C 7/1051; G11C 8/00; G11C 8/12
See application file for complete search history.

(56) References Cited

U.S. PATENT DOCUMENTS

| | | | | |
|---|---|---|---|---|
| 6,025,740 A | * | 2/2000 | Fukuyama | ....... H03K 19/00323 326/101 |
| 6,636,110 B1 | * | 10/2003 | Ooishi | ....... G06F 1/10 327/295 |
| 6,958,638 B2 | | 10/2005 | Shibata et al. | |
| 7,026,667 B2 | * | 4/2006 | Itoh | ....... G06F 1/10 257/202 |
| 8,164,372 B2 | | 4/2012 | Mitsubori et al. | |
| 2001/0005146 A1 | * | 6/2001 | Takekuma | ....... G06F 13/4077 326/30 |
| 2003/0063697 A1 | * | 4/2003 | Itoh | ....... G06F 1/10 375/356 |
| 2009/0108893 A1 | * | 4/2009 | Otsuka | ....... G06F 1/10 327/161 |

* cited by examiner

*Primary Examiner* — Hien N Nguyen
(74) *Attorney, Agent, or Firm* — Dorsey & Whitney LLP (57) ABSTRACT

Apparatuses for providing a clock signal for a plurality of circuits of a semiconductor device within delays in a certain range are described. An example apparatus includes a signal wire including a first portion and a second portion, having one ends coupled to each other at a signal input and the other ends coupled to each other that extend in parallel. The second portion has a higher impedance than the first portion from the first end to the second end. Output buffers closer to the signal input are coupled to the second portion and output buffers farther to the signal input are coupled to the first portion.

20 Claims, 10 Drawing Sheets

WIRING WITH EXTERNAL TERMINAL

BACKGROUND

High data reliability, high speed of memory access, reduced chip size and reduced power consumption are features that are demanded from semiconductor memory.

Figure 1A:
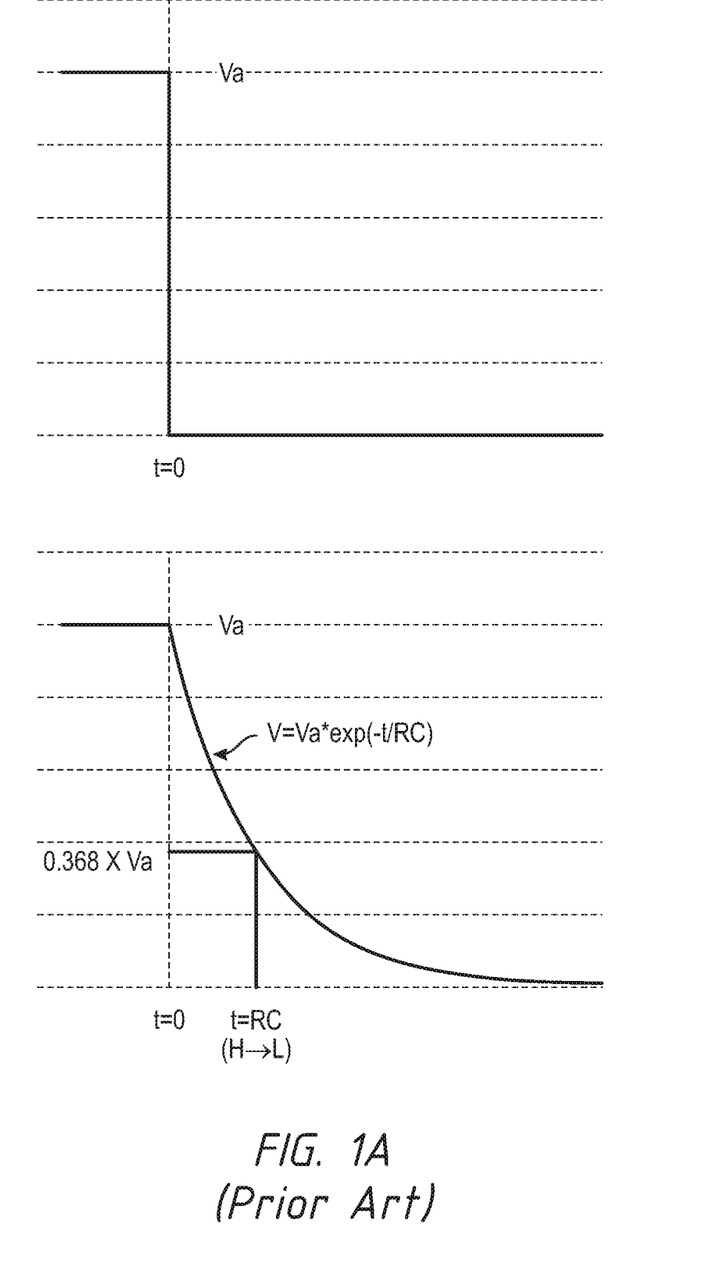
FIG. 1A is a schematic diagram of a level of clock signal for data read switching from a high level to a low level in the DQ circuit around external terminals in a conventional semiconductor device.

In conventional peripheral circuitries for a semiconductor device, for example, data queue circuits (or data input/output circuits) are arranged in a corresponding manner across layers. Each data queue circuit or data input/output circuit is called collectively "DQ circuit" hereinafter. FIG. 1A is a schematic diagram of a level of clock signal for data read switching from a high level to a low level in the DQ circuit around external terminals in a conventional semiconductor device. In an ideal situation, where a clock signal level is supposed to switch from a high level at a voltage Va to a low level at zero voltage instant instantly so that a waveform has an abrupt fall at t=0 as shown in an upper side of FIG. 1A. However, in actual situations, there is a transmission delay from a clock buffer to each DQ circuit. Depending on a transmission distance between the clock buffer and each DQ circuit, there is a transmission delay. For example, when a clock transmission circuit (wirings between the clock buffer and DQ circuits) has a parasitic capacitance C and a transmission impedance R between the clock buffer and the DQ circuit due to the transmission distance, a clock signal at the DQ circuit may have a voltage V that may decrease exponentially depending on time and the voltage V may be expressed as a formula below.

$$V = Va * \exp(-t/RC)$$

If a detection threshold of a clock signal level between the high level and the low level is at 0.368*Va, then the time when the clock signal level switches from the high level to the low level is expressed by a product of the transmission impedance R and the parasitic capacitance C (e.g., at t=RC). Thus, the transmission delay for each DQ circuit is proportional to the transmission impedance R between the clock buffer and each DQ circuit.

Figure 1B:
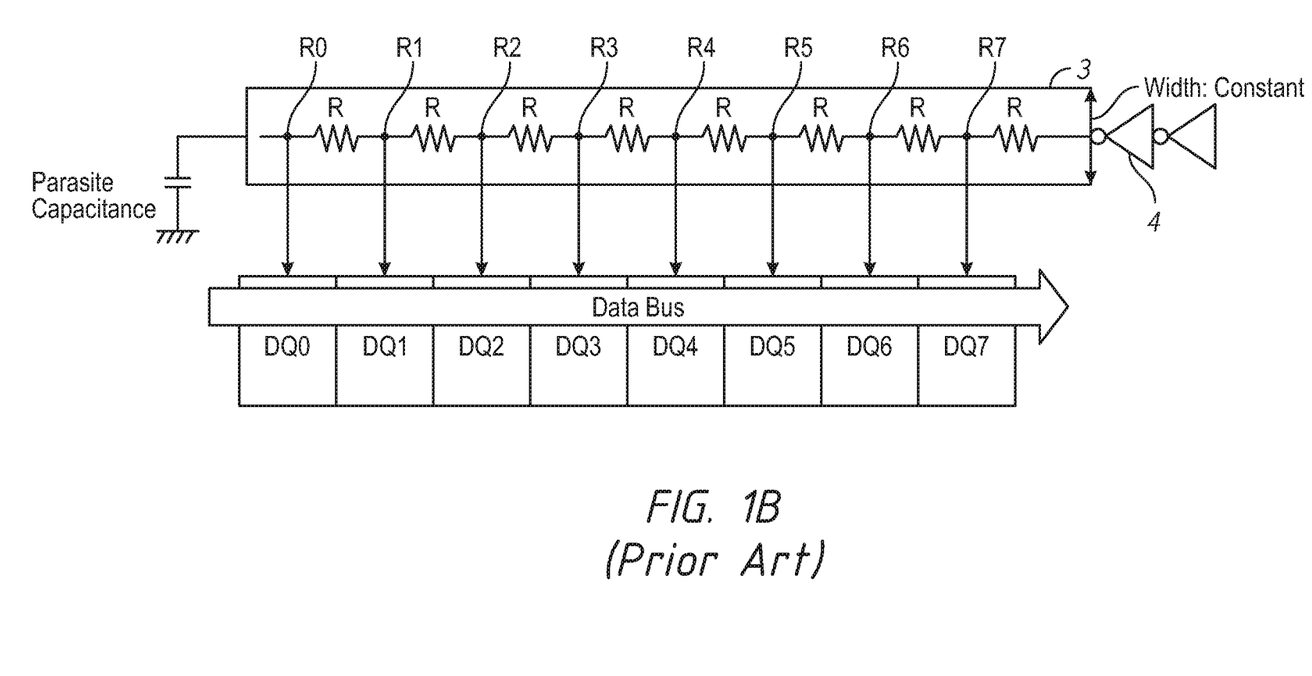
FIG. 1B is a schematic diagram of a conventional clock transmission circuit that includes a wiring coupled to DQ circuits.
Figure 1C:
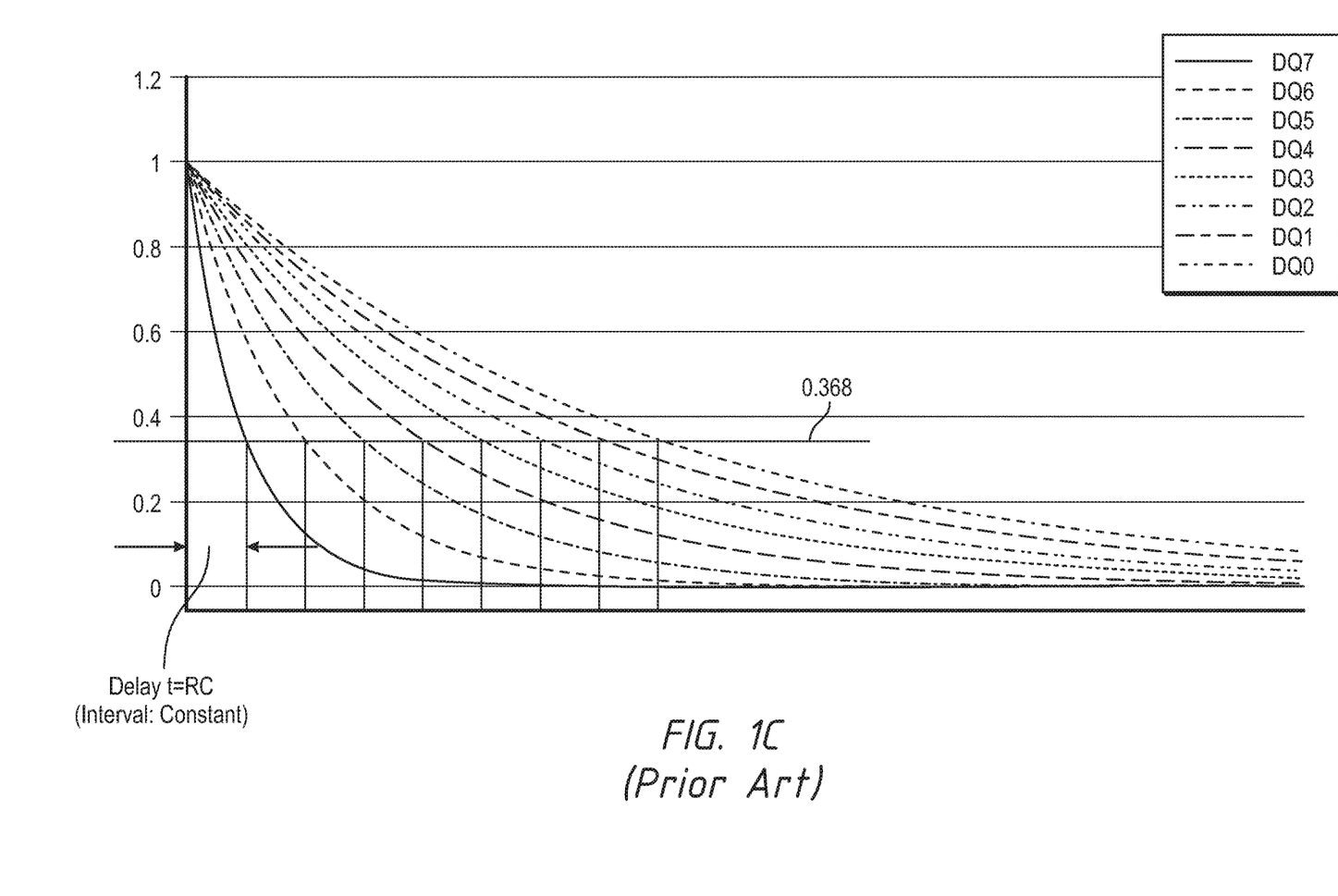
FIG. 1C is a schematic diagram showing a clock signal level switching from a high level to a low level in the DQ circuits around external terminals in the conventional semiconductor device.

FIG. 1B is a schematic diagram of a conventional clock transmission circuit 3 that includes a wire coupled to DQ circuits. The conventional clock transmission circuit 3 receives a clock signal from a clock buffer 4. The wire may include transmission impedances 8*R, that can provide impedances R0, R1, R2, R3, R4, R5, R6 and R7 to DQ circuits DQ0, DQ1, DQ2, DQ3, DQ4, DQ5, DQ6, DQ7, respectively. For example, transmission distances between neighboring DQ circuits on the wire providing transmission of a clock signal for read operation are set constant to have a transmission impedance R between two neighboring DQ circuits. Thus, the transmission impedances R0, R1, R2, R3, R4, R5, R6 and R7 to DQ circuits DQ0, DQ1, DQ2, DQ3, DQ4, DQ5, DQ6, and DQ7 may be 8R, 7R, 6R, 5R, 4R, 3R, 2R and R, respectively. FIG. 1C is a schematic diagram showing a clock signal level switching from a high level to a low level in the DQ circuits around external terminals in the conventional semiconductor device. Depending on the transmission impedances R0, R1, R2, R3, R4, R5, R6 and R7 for DQ circuits DQ0, DQ1, DQ2, DQ3, DQ4, DQ5, DQ6, and DQ7, the transmission delays for DQ circuits DQ0, DQ1, DQ2, DQ3, DQ4, DQ5, DQ6, and DQ7 are 8RC, 7RC, 6RC, 5RC, 4RC, 3RC, 2RC and RC, respectively. Thus, the transmission delay, 7RC, of the clock signal between the DQ circuits DQ0 and DQ7 is not negligible in achieving desired high memory access speed.

Figure 1D:
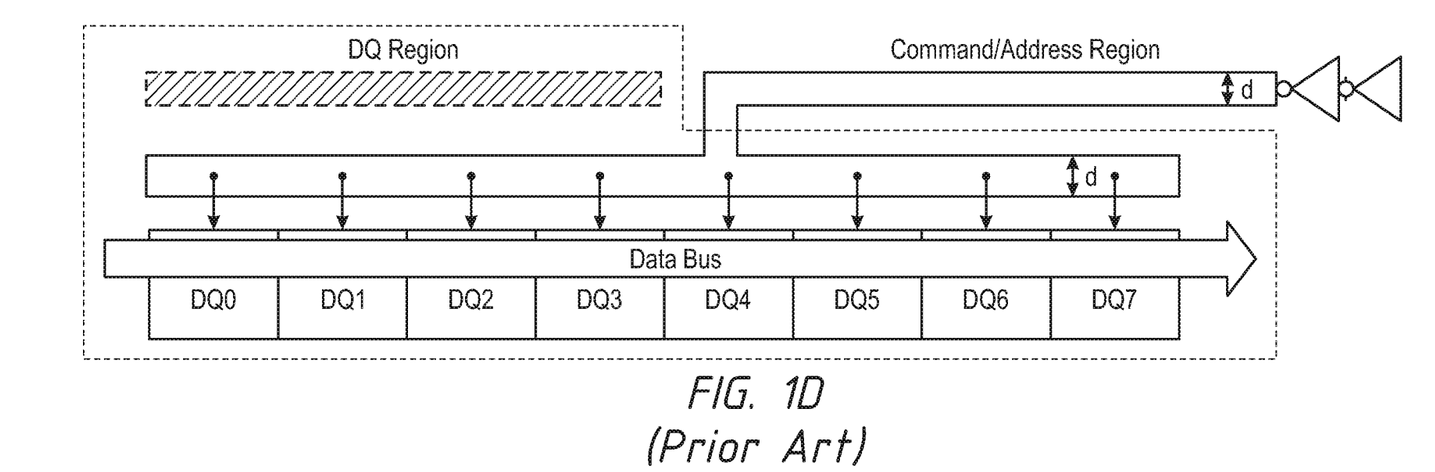
FIGS. 1D and 1E are schematic diagrams of conventional clock transmission circuits that include a wiring between a clock buffer and DQ circuits.
Figure 1E:
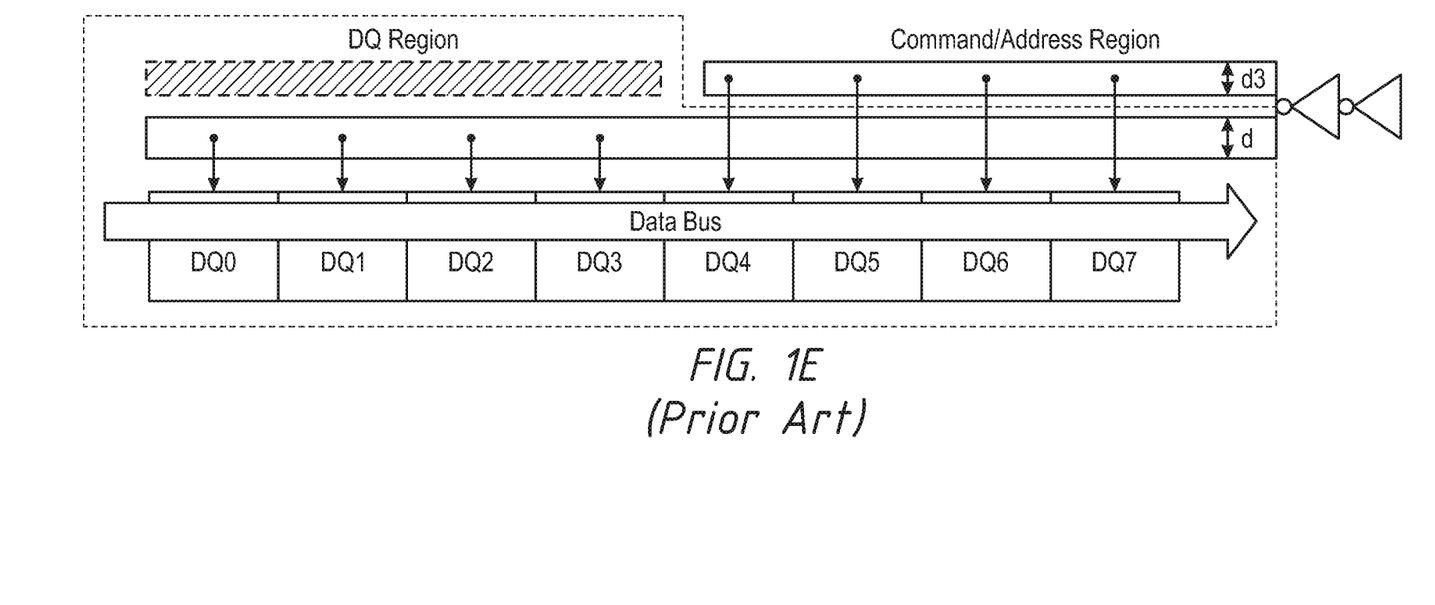

In recent years, there has been an effort to reduce the transmission delay of the clock signal. For example, in one approach shown in FIG. 1D, a clock transmission circuit provides a clock signal from a clock buffer to a point between the DQ circuits DQ3 and DQ4, and the clock signal is transmitted to two directions, one from the DQ circuit DQ3 to the DQ circuit DQ0 and the other from the DQ circuit DQ4 to the DQ circuit DQ7. The wire has a width (=d) that is constant across the clock transmission circuit for the clock signal transmission. In another approach shown in FIG. 1E, a clock transmission circuit provides a clock signal from a clock buffer via two wires, a first wire having a width d and a second wire having a width d3 that is smaller than the width d of the first wire. The first wire with the width d provides the clock signal to the DQ circuits DQ0, DQ1, DQ2 and DQ3 and the second wire with the width d3 provides the clock signal to the DQ circuits DQ4, DQ6, DQ7. In either approach of FIGS. 1D and 1E, a command/address region may include a wiring of a tree structure. The wiring with the tree structure occupies a large area and causes a large capacitance in the command/address region. In FIGS. 1D and 1E, a DQ region dedicated for data transmission includes a hatched area in a layout including an extra wiring to equalize the parasitic capacitance for each DQ circuit. However, such extra wirings are less effective in usage of areas and wirings.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 2:
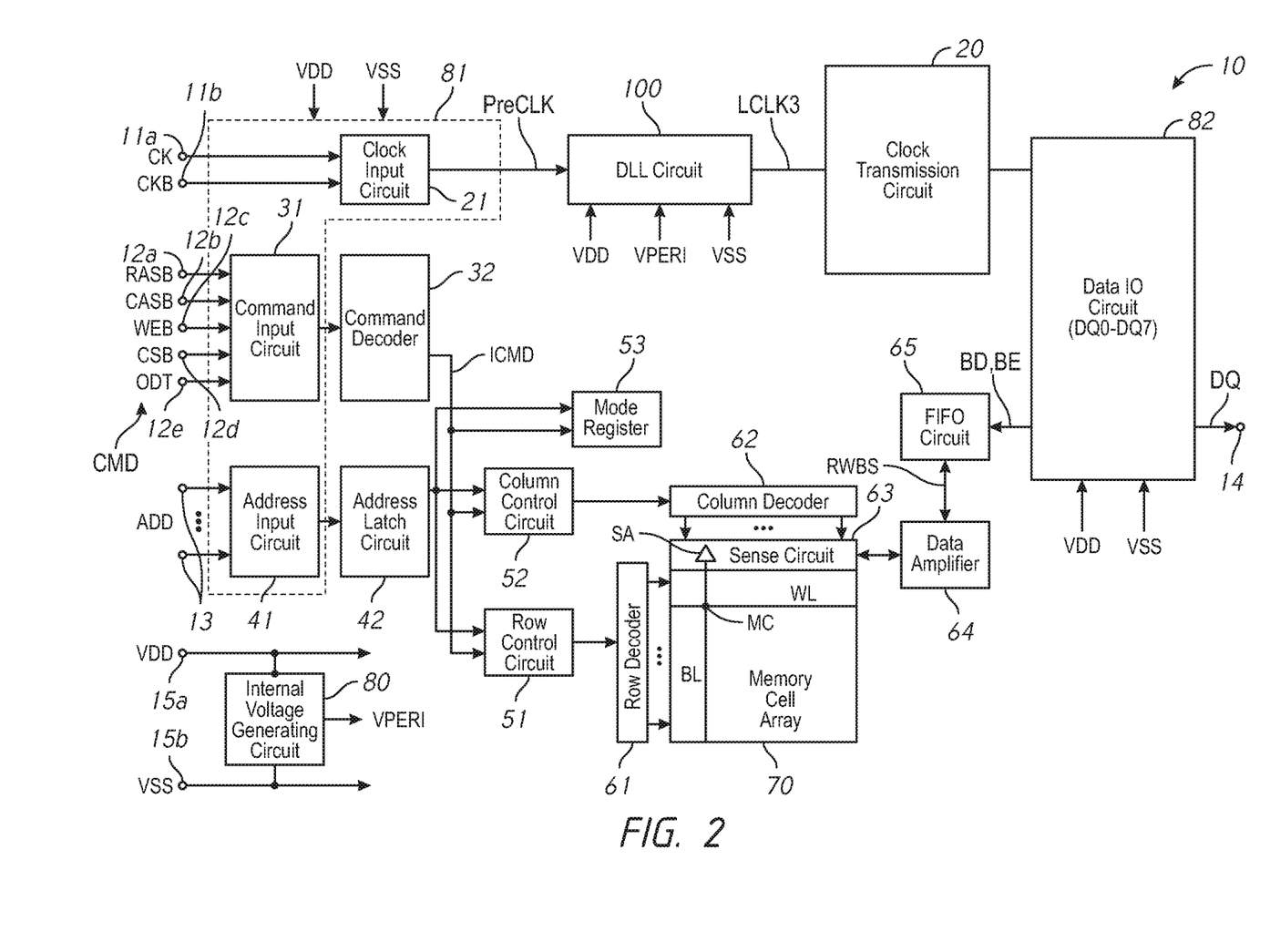
FIG. 2 is a block diagram of a semiconductor device 10 in accordance with an embodiment of the present disclosure.

FIG. 2 is a block diagram of a semiconductor device 10 in accordance with an embodiment of the present disclosure. The semiconductor device 10 is an apparatus (e.g., a DDR SDRAM), and includes, as external terminals, clock terminals 11a and 11b, command terminals 12a to 12e, an address terminal 13, a data input/output terminal (a data output terminal) 14, and power source terminals 15a and 15b. Although not shown in FIG. 2, the semiconductor device 10 also includes a data strobe terminal, a reset terminal and the like.

The clock terminals 11a and 11b may receive external clock signal CK and its complementary signal CKB, respectively and provide the external clock signals CK and CKB to a clock input circuit 21. The clock input circuit 21 generates an internal clock signal PreCLK of a single phase based on the external clock signals CK and CKB, and provides the internal clock signal PreCLK to a DLL circuit 100. The DLL circuit 100 generates a phase-controlled internal clock signal LCLK3 (a first internal clock signal), and provides the first internal clock signal LCLK3 to a data input/output circuit (DQ0-DQ7) 82 via a clock transmission circuit 20.

The command terminals 12a to 12e may receive a row address strobe signal RASB, a column address strobe signal CASB, a write enable signal WEB, a chip select signal CSB, and an on-die termination signal ODT, respectively and may further provide command signals CMD including the above signals to a command input circuit 31. The command input circuit 31 may then provide the command signals CMD to a command decoder 32. The command decoder 32 may generate various internal commands ICMD by storing, decoding, and counting the command signals, then further provide the internal commands ICMD to a row control circuit 51, a column control circuit 52, and a mode register 53.

The address terminal 13 may receive an address signal ADD and provide the address signal ADD to an address input circuit 41. The address input circuit 41 may provide an output signal to an address latch circuit 42. The address latch circuit 42 may latch the address signal ADD, and may provide a row address to the row control circuit 51, and a column address to the column control circuit 52. When a mode register set is activated, the mode register 53 may receive the address signal ADD and update contents of the mode register 53. The row control circuit 51 may provide an output signal to a row decoder 61. The row decoder 61 may select any one of word lines WL included in a memory cell array 70. In the memory cell array 70, a plurality of word lines WL and a plurality of bit lines BL interest with each other, and a memory cell MC is arranged at every intersection of the word lines WL with the bit lines BL (However, only one word line WL, one bit line BL, and one memory cell MC are shown in FIG. 2). Each of the bit lines BL is connected to its corresponding sense amplifier SA included in a sense circuit 63. An output of the column control circuit 52 is provided to a column decoder 62. The column decoder 62 is a circuit that selects any one of the sense amplifiers SA included in the sense circuit 63. The sense amplifier SA selected by the column decoder 62 is connected to a data amplifier 64. The data amplifier 64 further amplifies read data that is amplified by the sense amplifier SA at a time of a read operation, and provides the amplified read data to a FIFO circuit 65 via a read/write bus RWBS. On the other hand, at a time of a write operation, the data amplifier 64 amplifies write data that is provided from the FIFO circuit 65 via the read/write bus RWBS, and provides the amplified write data to the sense amplifier SA. The FIFO circuit 65 is connected to the data input/output circuit 82.

The data input/output terminal 14 is a terminal for performing an output of read data DQ and an input of write data DQ, being connected to the data input/output circuit 82. Although only one data input/output terminal 14 is shown in FIG. 2, the number of the data input/output terminal 14 does not have to be one, but can be used in plural as appropriate. A specific example described later (see FIG. 3) exemplifies a case that the number of the data input/output terminal 14 is eight.

The power source terminals 15a and 15b may receive an external power voltage VDD and a ground potential VSS, respectively. The external power voltage VDD is provided to an internal power voltage generating circuit 80 that may generate an internal power voltage VPERI that is a potential lower than the external power voltage VDD (VPERI<VDD) and provide the internal power voltage VPERI to most of the peripheral circuits shown in FIG. 2. Thus, most of the peripheral circuits may operate using the internal power voltage VPERI as their power sources. On the other hand, the external power voltage VDD may be provided to an input circuit group 81 and the data input/output circuit 82, thus the input circuit group 81 and the data input/output circuit 82 may operate using the external power voltage VDD as their power sources. In this manner, as most of the peripheral circuits except for the input circuit group 81 and the data input/output circuit 82 may operate using the internal power voltage VPERI, a lower voltage than the external power voltage VDD, to reduce the power consumption. In the memory cell array 70, an array voltage (VARAY), a high voltage (VPP) exceeding the external power voltage VDD, and a negative voltage (VBB) may be used (not shown). As the external power voltage VDD is provided to the input circuit group 81 including the input circuits 21, 31 and 41, the input circuits 21, 31 and 41 may provide output signals having amplitudes of voltages the external power voltage VDD. However, because a circuit at the next stage is operated with the internal power voltage VPERI, amplitudes of voltages of signals at the following stages become the internal power voltage VPERI.

Figure 3:
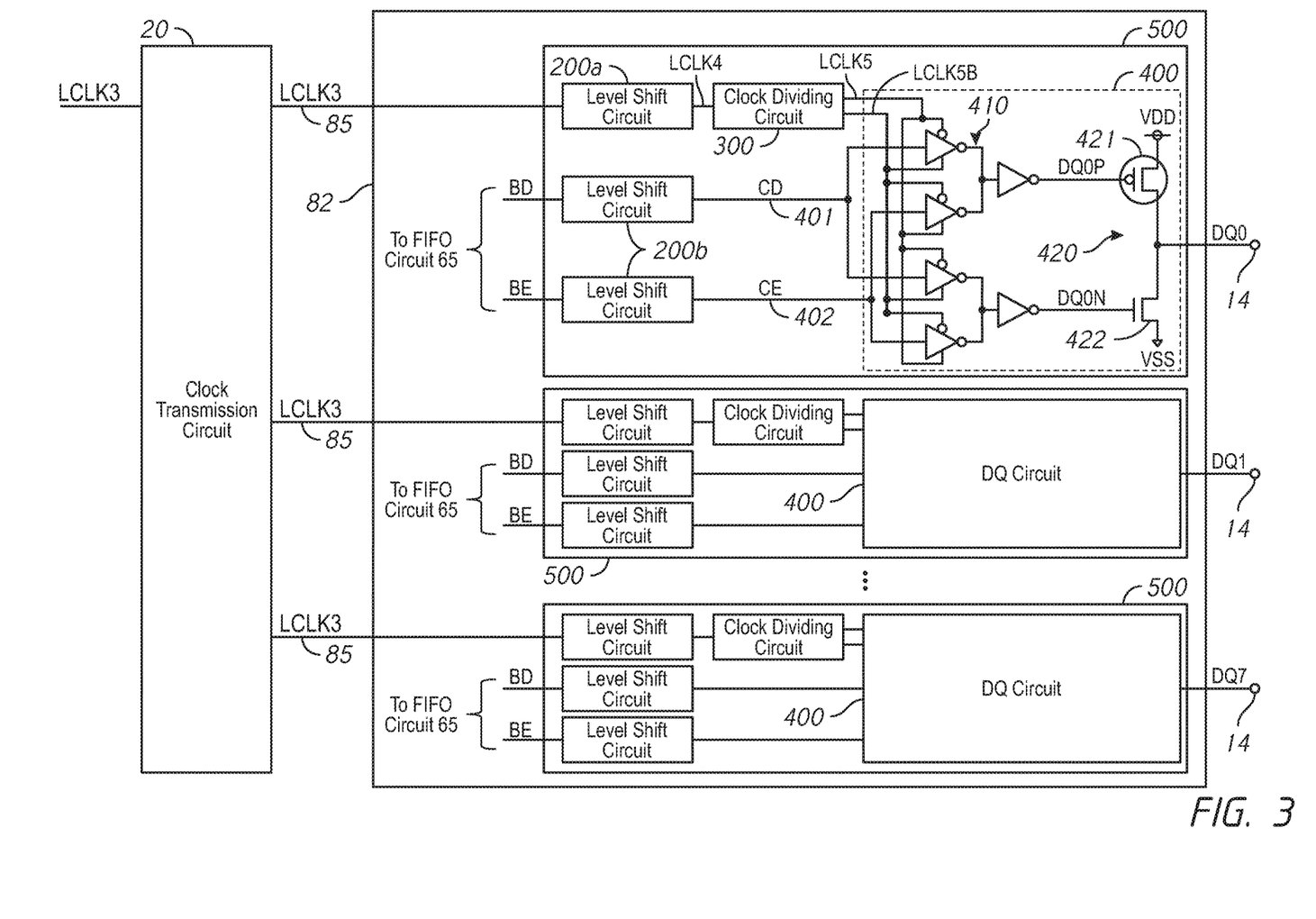
FIG. 3 is a block diagram of a data input/output circuit and a clock transmission circuit in accordance with an embodiment of the present disclosure.

FIG. 3 is a schematic diagram of a data input/output circuit 82 and an apparatus that is a clock transmission circuit 20 in accordance with an embodiment of the present disclosure. For example, the data input/output circuit 82 and the clock transmission circuit 20 may be used as the data input/output circuit 82 and the clock transmission circuit 20 in FIG. 2.

The data input/output circuit 82 may include a plurality of sub data input/output circuits 500 that are coupled to data input/output terminals (DQ0 to DQ7) 14 for receiving or providing data. Each sub data input/output circuit 500a may include a level shift circuit 200a for level shifting a clock signal, level shift circuits 200b for level-shifting data signals BD and BE into internal data signals CD and CE respectively, a clock dividing circuit 300, and a data queue (DQ)

circuit (e.g., a data buffer) 400. The level shift circuits 200a and 200b may convert a signal having the amplitude of the internal power voltage VPERI into a signal having the amplitude of the external power voltage VDD. Therefore, amplitudes of voltages of signals used in the clock dividing circuit 300 and the DQ circuit 400 become the external power voltage VDD. For example, the level shift circuit 200a may generate an internal clock signal LCLK4 (a second internal clock signal) by performing a level shift of the internal clock signal LCLK3. The clock dividing circuit 300 may receive the internal clock LCLK4 of the single phase, may generate internal clock signal LCLK5 and its complementary signal LCLK5B (select clock signals) from the internal clock signal LCLK4, and may further provide the complementary internal clock signals LCLK5 and LCLK5B to the DQ circuit 400. At the time of the read operation, the DQ circuit 400 that functions as a data buffer may burst output the read data DQ in synchronization with the internal clock signals LCLK5 and LCLK5B.

The DQ circuit 400 may include a multiplexer 410 and an output buffer 420. The multiplexer 410 may receive the internal data signals CD and CE through data lines 401 and 402, respectively. For example, the DQ circuit 400 for DQ0 include the output buffer 420 that may receive signals DQ0P and DQ0N from the multiplexer 410. The output buffer 420 in the DQ circuit 400 for DQ0 may further provide read data (an external data signal) DQ0 from the data input/output terminal 14 for DQ0 based on the signals DQ0P and DQ0N.

For example, the multiplexer 410 may be a clocked driver that provides the internal data signal CD from the data line 401 responsive to a rising edge of the internal clock signal LCLK5. Furthermore, the multiplexer 410 may provide the internal data signal CE from the data line 402 responsive to a rising edge of the internal clock signal LCLK5B. The multiplexer 410 may provide the signals DQ0P and DQ0N respectively to gate electrodes of a P-channel MOS transistor 421 (an output transistor) and an N-channel MOS transistor 422 (an output transistor) that constitute the output buffer 420. At the rising edge of the internal clock signal LCLK5, either one of the transistors 421 and 422 may be turned on responsive to a logic level of the internal data signal CD to provide an external data signal DQ of either a high level or a low level. Similarly, at the rising edge of the internal clock signal LCLK5B, either one of the transistors 421 and 422 may be turned on responsive to a logic level of the internal data signal CE to provide an external data signal DQ of either a high level or a low level. With this operation, the data input/output terminal 14 may provide the external data signal DQ0 continuously.

As described earlier, the level shift circuits 200b may provide the internal data signals CD and CE through the data lines 401 and 402 respectively, responsive to the data signals BD and BE after level-shifting. In this example, the level-shifting circuits converting the data signals BD and BE into the internal data signals CD and CE having the external power voltage amplitudes of voltages may be outside of the DQ circuit 400, however, it may be possible to include the level-shifting circuits within the DQ circuit 400. Similarly in this example, the clock dividing circuit 300 providing the internal clock signals LCLK5 and LCLK5B after level-shifting may be included either outside or inside of the DQ circuit 400.

In FIG. 3, eight data input/output terminals 14 are arranged as an example, where 8 bits of read data DQ0 to DQ7 may be provided in parallel at the data input/output terminals (DQ0-DQ7) 14. As shown in FIG. 3, when the eight data input/output terminal 14 are arranged, eight sets of the level shift circuits 200a and 200b, the clock dividing circuit 300, and the data input/output circuit 400 may be arranged accordingly.

Figure 4A:
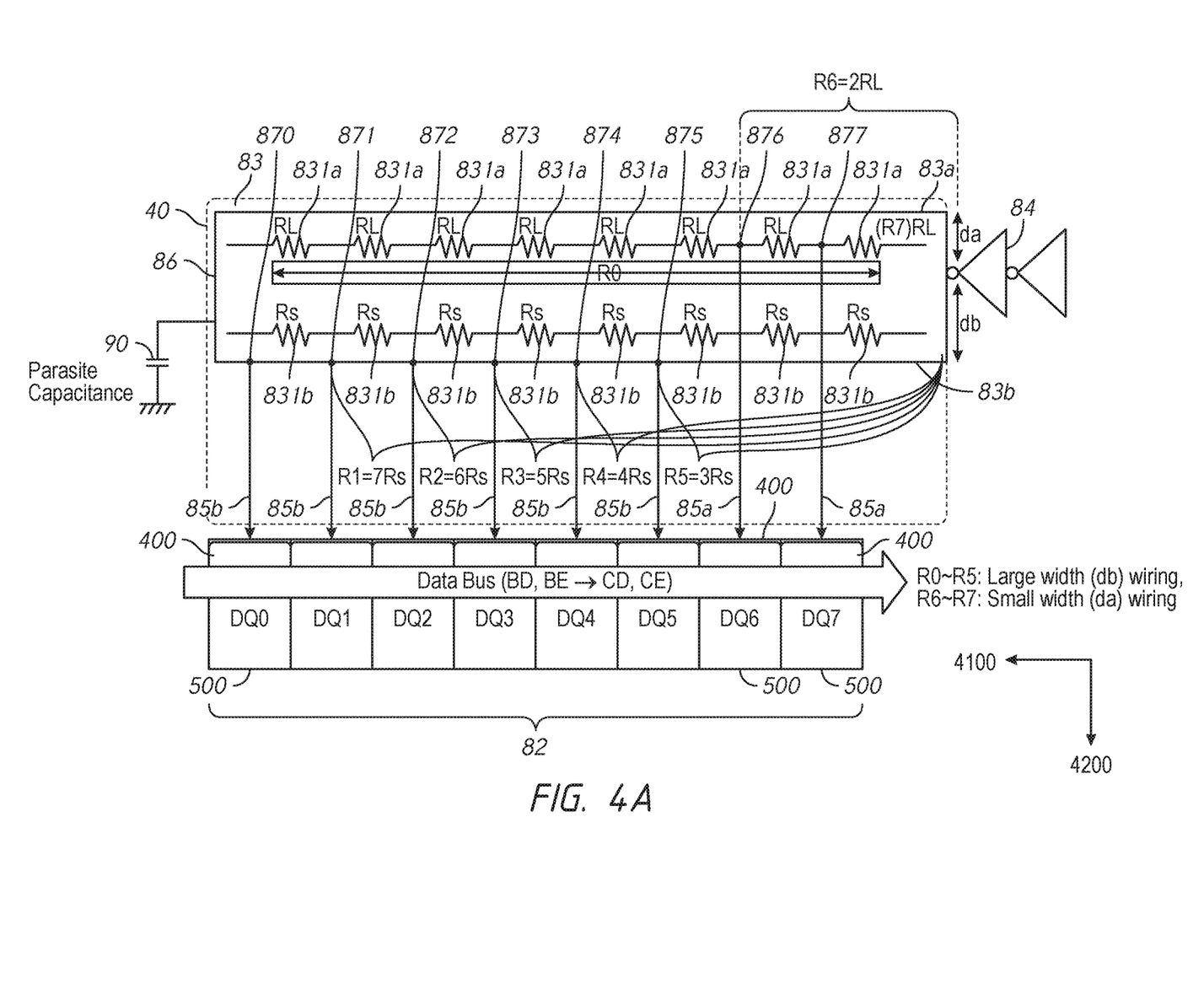
FIG. 4A is a schematic diagram of a data input/output circuit and a clock transmission circuit in accordance with an embodiment of the present disclosure.

FIG. 4A is a schematic diagram of a data input/output circuit 82 and a clock transmission circuit 40 in accordance with an embodiment of the present disclosure. For example, the data input/output circuit 82 and the clock transmission circuit 40 may be used as the data input/output circuit 82 and the clock transmission circuit 20 in FIG. 2. However, the clock transmission circuit 40 may provide a clock signal that is used for receiving command and address signals, and is not limited to reading data signals. For example, a command signal or an address signal may be received and transmitted by command/address buffers within a command/address circuit region (CA region) responsive to a clock signal from the clock transmission circuit 40.

The data input/output circuit 82 may include the plurality of sub data input/output circuits 500 that are coupled to responsive data input/output terminals (DQ0 to DQ7) 14 for receiving or providing data. For example, the clock transmission circuit 40 may receive a clock signal from a signal buffer 84. The plurality of sub data input/output circuits 500 may be arranged in a first direction 4100 in a manner that the sub data input/output circuits 500 for DQ7, DQ6, DQ5, DQ4, DQ3, DQ2, DQ1, and DQ0 are aligned in this order from the signal buffer 84. A distance between the sub data input/output circuit 500 for DQ7 and the signal buffer 84 is shorter than a distance between the sub data input/output circuit 500 for DQ0. The clock transmission circuit 40 may include a signal wire 83 including a first portion (e.g., a first straight line) 83a and a second portion (e.g., a second straight line) 83b. The first portion 83a may extend in the first direction 4100. The first portion 83a may have a width "da" in a second direction 4200 that is perpendicular to the first direction 4100. The second portion 83b may extend in the first direction 4100 substantially apart from (e.g., in parallel with) the first portion 83a. For example, the first and second portions 83a and 83b of the signal wire 83 may be substantially straight. For example, the second portion 83b may have a width "db", which is greater than the width "da" of the first portion 83a (db>da), in the second direction 4200. The first portion 83a may have a first end and a second end. The first end of the first portion 83a may be coupled to the signal buffer 84, and the first portion 83a may receive a clock signal from the signal buffer 84 at the first end. The second portion 83b may have a first end and a second end. The first end of the second portion 83b may be coupled to the signal buffer 84, and the second portion 83b may receive the clock signal from the signal buffer 84 at the first end. The signal wire 83 may further include a node 86 that may couple the second end of the first portion 83a to the second end of the second portion 83b, thus the node 86 may become a closed end of the signal wire 83. The signal wire 83 may be physically arranged in a circular pattern of the same leveled metal layer. Alternatively, the signal wire 83 may be electrically arranged in a circular pattern by providing respective contacts (not shown) that couple the signal buffer 84 to the first ends of the first portion 83a and to the second portion 83b respectively to provide the clock signal, while the first ends of the first portion 83a and the second portion 83b are not physically connected to each other. The first portion 83a from the first end to the second end may have a higher impedance than the second portion 83b from the first end to the second end. For example, the impedance difference may be caused by widths of the first and second portions of the same material. Alternatively, the impedance difference may be caused by different conductivities of the materials or other attributes (e.g., lower conductivity for the first portion 83a and higher conductivity for the second portion 83b). A capacitance 90 may be a parasite capacitance of the signal wire 83.

The clock transmission circuit 40 may further include signal wires 85a having one ends coupled to nodes 876 and 877 on the first portion 83a and other ends coupled to DQ circuits 400 of the sub data input/output circuits 500 for DQ6 and DQ7, respectively. For example, the signal wires 85a may extend in the second direction 4200. Thus, the signal wires 85a may couple the first portion 83a having the smaller width "da" to the DQ circuits 400 of the sub data input/output circuits 500 for DQ6 and DQ7, respectively. The first portion 83a may correspond to a plurality of sub-wires 831a coupled in series, where each sub-wire 831a (e.g., a portion of the first portion 83a) of the plurality of sub-wires 831a has an impedance $R_L$. The impedance $R_L$ may be equivalent to an impedance of a sub-wire 831a between two signal wires 85a next to each other coupled to the DQ circuits 400 of two sub data input/output circuits 500 arranged next to each other (e.g., an impedance between the nodes 876 and 877, etc.). For example, an impedance between the signal buffer 84 and the node 876 may be approximated as $2R_L$. Similarly, the impedance between the signal buffer 84 and the node 877 may be approximated as $R_L$. The signal wires 85a may be on a first metal layer M1 that is closer or on the substrate, and the first portion 83a may be on either a second metal layer M2 or a third metal layer M3 that is farther than the first metal layer M1 to the substrate.

The clock transmission circuit 40 may further include signal wires 85b having one ends coupled to nodes 870, 871, 872, 873, 874 and 875 on the second portion 83b and other ends coupled to DQ circuits 400 of the sub data input/output circuits 500 for DQ0, DQ1, DQ2, DQ3, DQ4 and DQ5, respectively. For example, the signal wires 85b may extend in the second direction 4200. Thus, the signal wires 85b may couple the second portion 83b having the greater width "db" to the DQ circuits 400 of the sub data input/output circuits 500 for DQ0, DQ1, DQ2, DQ3, DQ4 and DQ5, respectively. Distances between the first end of the first portion 83a coupled to the signal buffer 84 and the nodes 876, 877 (e.g., lengths between the first end of the first portion 83a coupled to the signal buffer 84 and the nodes 876, 877) may be shorter than distances between the first end of the second portion 83b coupled to the signal buffer 84 and the nodes 870, 871, 872, 873, 874 and 875 (e.g., lengths of the second portion between the first end of the second portion 83b coupled to the signal buffer 84 and the nodes 870, 871, 872, 873, 874 and 875). The second portion 83b may correspond to a plurality of sub-wires 831b coupled in series, where each sub-wire 831b (e.g., a portion of the second portion 83b) of the plurality of sub-wires 831b has an impedance Rs. The impedance Rs may be equivalent to an impedance of a sub-wire 831b between two signal wires 85b next to each other coupled to DQ circuits 400 of two sub data input/ output circuits 500 arranged next to each other (e.g., an impedance between the nodes 871 and 872, etc.). For example, impedances between the signal buffer 84 and the nodes 871, 872, 873, 874 and 875 may be approximated as 7Rs, 6Rs, 5Rs, 4Rs and 3Rs, respectively. Because the node 86 (e.g., the node 870) on the signal wire 83 may be the other ends of the first and second portions 83a and 83b of the signal wire 83, an impedance R0 between the node 86 (the node 870) and the signal buffer 84 may be lower than either $8R_L$ or 8Rs. The signal wires 85b may be on the first metal layer M1 that is closer on the substrate, and the second portion 83b may be on either the second metal layer M2 or the third metal layer M3 that is farther than the first metal layer M1 to the substrate.

Figure 4B:
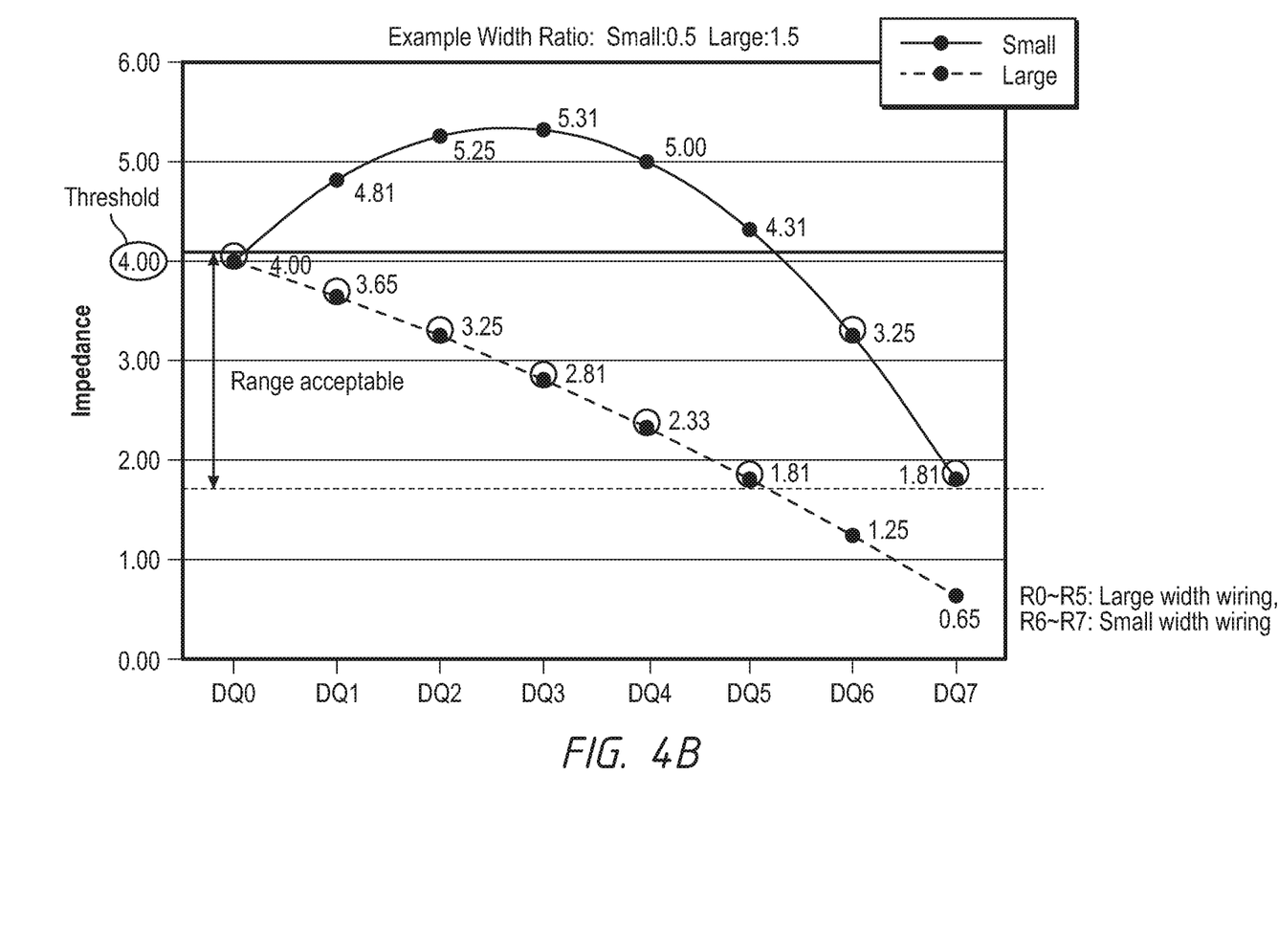
FIG. 4B is a schematic diagram showing an example relationship between distances and impedances for a signal buffer and a plurality of sub data input/output circuits in accordance with an embodiment of the present disclosure.

FIG. 4B is a schematic diagram showing an example relationship between distances and impedances for the signal buffer 84 and the plurality of sub data input/output circuits 500 in accordance with an embodiment of the present disclosure. Width ratios and impedances shown in FIG. 4B are merely examples and different width ratios and impedances may be used without departing from the scope of the present disclosure. The impedance Rs of the sub-wire 831b is lower than the impedance $R_L$ of the sub-wire 831a, when the first portion 83a and the second portion 83b may be made from a same material on a same metal layer and having widths "da" and "db" where "da" is smaller than "db". For example, the ratio of the widths between da and db may be 1:2 or 1:3. In FIG. 4B, the example width ratio between da and db is 1:3 (0.5 and 1.5). With the above structure, the sub data input/output circuits 500 for DQ7 and DQ6 having shorter distances to the signal buffer 84 may be coupled to the first portion 83a at the nodes 877 and 876, respectively. Thus, higher impedances (1.83 and 3.25, instead of 0.65 and 1.25) may be caused by the first portion 83a with the smaller width "da" between the signal buffer 84 and the nodes 877 and 876, respectively. At the same time, the sub data input/output circuits 500 for DQ1, DQ2, DQ3, DQ4 and DQ5 having longer distances to the signal buffer 84 may be coupled to the second portion 83b with the greater width "db" at the nodes 871, 872, 873, 874, 875, respectively. Thus, lower impedances (3.65, 3.25, 2.81, 2.33, 1.81 instead of 4.81, 5.25, 5.31, 5.00, 4.31) may be caused by the second portion 83b with the greater width "db" between the signal buffer 84 and the nodes 871, 872, 873, 874 and 875, respectively. Therefore, the impedances between the signal buffer 84 and the plurality of sub data input/output circuits 500 may be kept within a predetermined range (e.g., between 1.81 and 4.00 instead of between 0.65 and 4.00 or between 1.81 and 5.31) and delays corresponding to the impedances as schematically shown in FIGS. 1A and 1C may be controlled within a predetermined range.

Figure 5A:
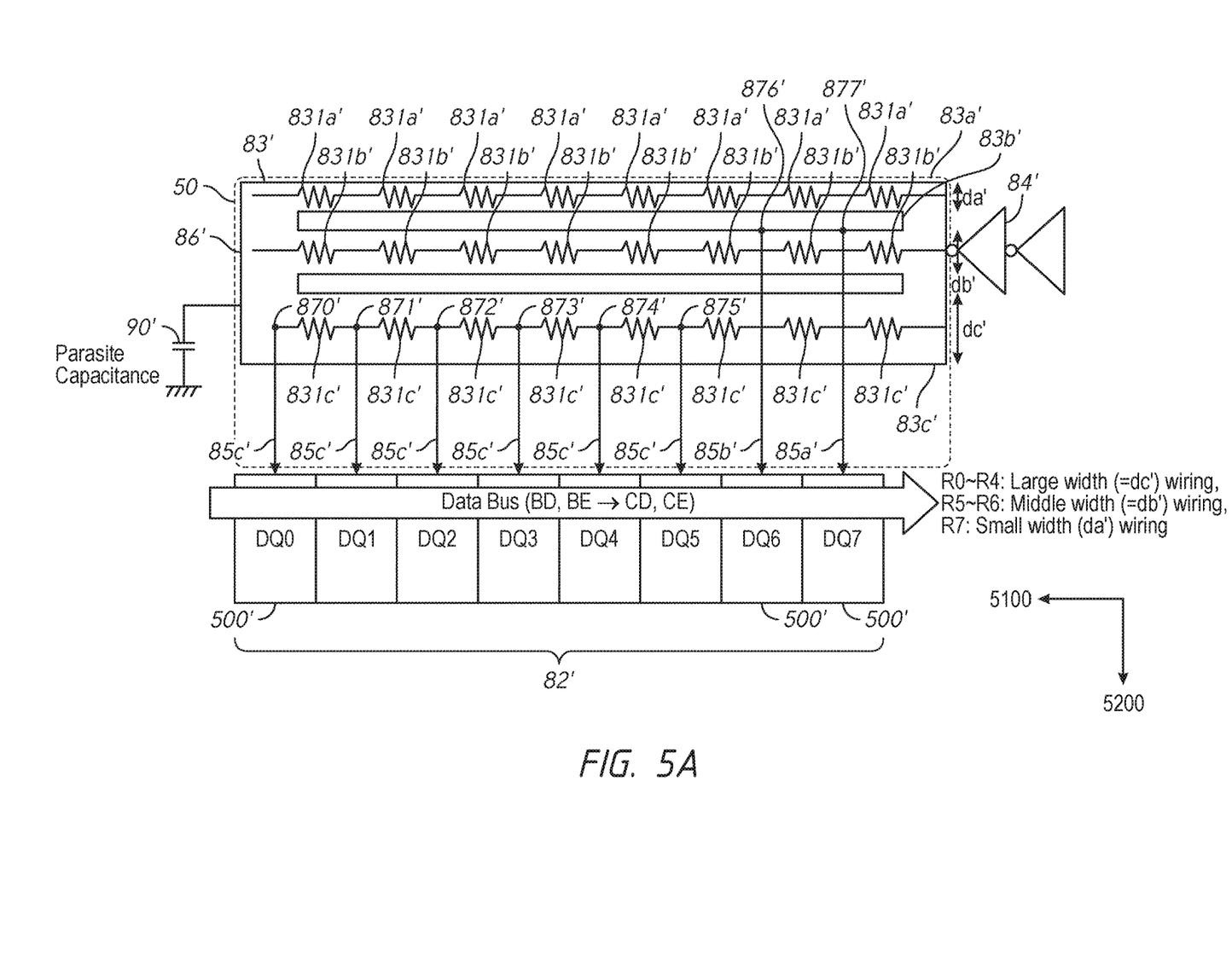
FIG. 5A is a schematic diagram of a data input/output circuit and a clock transmission circuit in accordance with an embodiment of the present disclosure.

FIG. 5A is a schematic diagram of a data input/output circuit 82' and a clock transmission circuit 50 in accordance with an embodiment of the present disclosure. For example, the data input/output circuit 82' and the clock transmission circuit 50 may be used as the data input/output circuit 82 and the clock transmission circuit 20 in FIG. 2. However, the clock transmission circuit 50 may provide a clock signal that is used for receiving command and address signals, and is not limited to reading data signals. For example, a command signal or an address signal may be received and transmitted by command/address buffers within a CA region responsive to a clock signal from the clock transmission circuit 50.

The data input/output circuit 82' may include the plurality of sub data input/output circuits 500' that are coupled to responsive data input/output terminals (DQ0 to DQ7) 14 for receiving or providing data. For example, the clock transmission circuit 50 may receive a signal buffer 84'. The plurality of sub data input/output circuits 500' may be arranged in a first direction 5100 in a manner that the sub data input/output circuits 500' for DQ7, DQ6, DQ5, DQ4, DQ3, DQ2, DQ1, and DQ0 are aligned in this order from the signal buffer 84'. The clock transmission circuit 50 may include a signal wire 83' including a first portion (e.g., a first straight line) 83a', a second portion (e.g., a second straight line) 83b' and a third portion (e.g., a third straight line) 83c'. The first portion 83a' may extend in the first direction 5100. The first portion 83a' may have a width "da'" in a second direction 5200 that is perpendicular to the first direction 5100. The second portion 83b' may extend in the first direction 5100 substantially apart from (e.g., in parallel with) the first portion 83a'. The second portion 83b' may have a width "db'", which is greater than the width "da'" of the first portion 83a' (db'>da'), in the second direction 5200. The third portion 83c' may extend in the first direction 5100 substantially apart from (e.g., in parallel with) the first portion 83a' and the second portion 83b'. The third portion 83c' may have a width "dc'", which is greater than the width "db'" of the first portion 83a' (dc'>db'), in the second direction 5200. Each of the first portion 83a', the second portion 83b' and the third portion 83c' may have a first end and a second end. For example, the first, second and third portions 83a', 83b' and 83c' of the signal wire 83' may be substantially straight. The first end of the first portion 83a' may be coupled to the signal buffer 84', and the first portion 83a' may receive a clock signal from the signal buffer 84' at the first end. The first end of the second portion 83b' may be coupled to the signal buffer 84', and the second portion 83b' may receive the clock signal from the signal buffer 84' at the first end. The first end of the third portion 83c' may also be coupled to the signal buffer 84', and the third portion 83c' may receive the clock signal from the signal buffer 84' at the first end. The signal wire 83' may further include a node 86' that may couple the second ends of the first portion 83a', the second portion 83b' and the third portion 83c', thus the node 86' may become a closed end of the signal wire 83'. A capacitance 90' may be a parasite capacitance of the signal wire 83'.

For example, the clock transmission circuit 40' may further include a signal wire 85a' having a first end coupled to a node 877' on the first portion 83a' and a second end coupled to the sub data input/output circuit 500' for DQ7. For example, the signal wires 85a' may extend in the second direction 5200. For example, a DQ circuit 400 (included as in FIG. 3) of the sub data input/output circuit 500' for DQ7 may be coupled to the signal wire 85a'. Thus, the signal wire 85a' may couple the first portion 83a' having a smaller width "da'" to the DQ circuit 400 of the sub data input/output circuits 500' for DQ7. The first portion 83a' may correspond to a plurality of sub-wires 831a' coupled in series, where each sub-wire 831a' of the plurality of sub-wires 831a' may have an impedance $R_L'$. Thus the impedance between the signal buffer 84' and the node 877' may be approximated as $R_L'$. The signal wires 85a' may be on a first metal layer M1 that is closer on the substrate, and the first portion 83a' may be on either a second metal layer M2 or a third metal layer M3 that is farther than the first metal layer M1 to the substrate.

The clock transmission circuit 40' may further include signal wires 85b' having one ends coupled to nodes 875' and 876' on the second portion 83b' and other ends coupled to DQ circuits 400 of the sub data input/output circuits 500' for DQ5 and DQ6, respectively. For example, the signal wires 85b' may extend in the second direction 5200. Thus, the signal wires 85b' may couple the second portion 83b' having the width "db'", which is greater than "da'" and smaller than "dc'", to the DQ circuits 400 of the sub data input/output circuits 500' for DQ5 and DQ6, respectively. The second portion 83b' may correspond to a plurality of sub-wires 831b' coupled in series, where each sub-wire 831b' of the plurality of sub-wires 831b' has an impedance $R_M$. The impedance $R_M$ may be equivalent to an impedance of a sub-wire 831b' between two signal wires 85b' next to each other coupled to DQ circuits 400 of two sub data input/output circuits 500' arranged next to each other (e.g., an impedance between the nodes 875' and 876'). For example, impedances between the signal buffer 84' and the nodes 875' and 876' may be approximated as $3R_M$ and $2R_M$, respectively. The signal wires 85b' may be on the first metal layer M1 that is closer or on the substrate, and the second portion 83b' may be on either the second metal layer M2 or the third metal layer M3 that is farther than the first metal layer M1 to the substrate.

The clock transmission circuit 40' may further include signal wires 85c' having one ends coupled to nodes 870', 871', 872', 873' and 874' on the third portion 83c' and other ends coupled to DQ circuits 400 of the sub data input/output circuits 500' for DQ0, DQ1, DQ2, DQ3 and DQ4, respectively. The signal wires 85c' may extend in the second direction 5200. Thus, the signal wires 85c' may couple the third portion 83c' having the width "dc'", which is greater than "da'" and "db'", to the DQ circuits 400 of the sub data input/output circuits 500' for DQ0, DQ1, DQ2, DQ3 and DQ4, respectively. A distance between the first end of the first portion 83a' coupled to the signal buffer 84' and the node 877' (e.g., a length between the first end of the first portion 83a' coupled to the signal buffer 84' and the node 877') may be shorter than distances between the first end of the second portion 83b' coupled to the signal buffer 84' and the nodes 875' and 876' (e.g., lengths between the first end of the first portion 83b' coupled to the signal buffer 84' and the nodes 875', 876'). The distances between the first end of the second portion 83b' and the nodes 875' and 876' may be shorter than distances between the first end of the third portion 83c' coupled to the signal buffer 84' and the nodes 870', 871', 872', 873' and 874' (e.g., lengths between the first end of the first portion 83c' coupled to the signal buffer 84' and the nodes 870', 871', 872', 873' and 874'). The third portion 83c' may correspond to a plurality of sub-wires 831c' coupled in series, where each sub-wire 831c' of the plurality of sub-wires 831c' has an impedance Rs. The impedance Rs may be equivalent to an impedance of a sub-wire 831c' between two signal wires 85b' next to each other coupled to DQ circuits 400 of two sub data input/output circuits 500' arranged next to each other (e.g., an impedance between the nodes 871' and 872', between the nodes 872' and 873', or between the nodes 873' and 874', etc.). For example, impedances between the signal buffer 84' and the nodes 871', 872', 873' and 874' may be approximated as 7Rs, 6Rs, 5Rs and 4Rs, respectively. Because the node 86' (e.g., the node 870') on the signal wire 83' may be the other ends of the first, second and third portions 83a', 83b' and 83c' of the signal wire 83', an impedance R0 between the node 86 (the node 870) and the signal buffer 84 may be lower than either $8R_L$, $8R_M$ or 8Rs. For example, the signal wires 85c' may be on the first metal layer M1 that is closer or on the substrate, and the third portion 83c' may be on either the second metal layer M2 or the third metal layer M3 that is farther than the first metal layer M to the substrate.

Figure 5B:
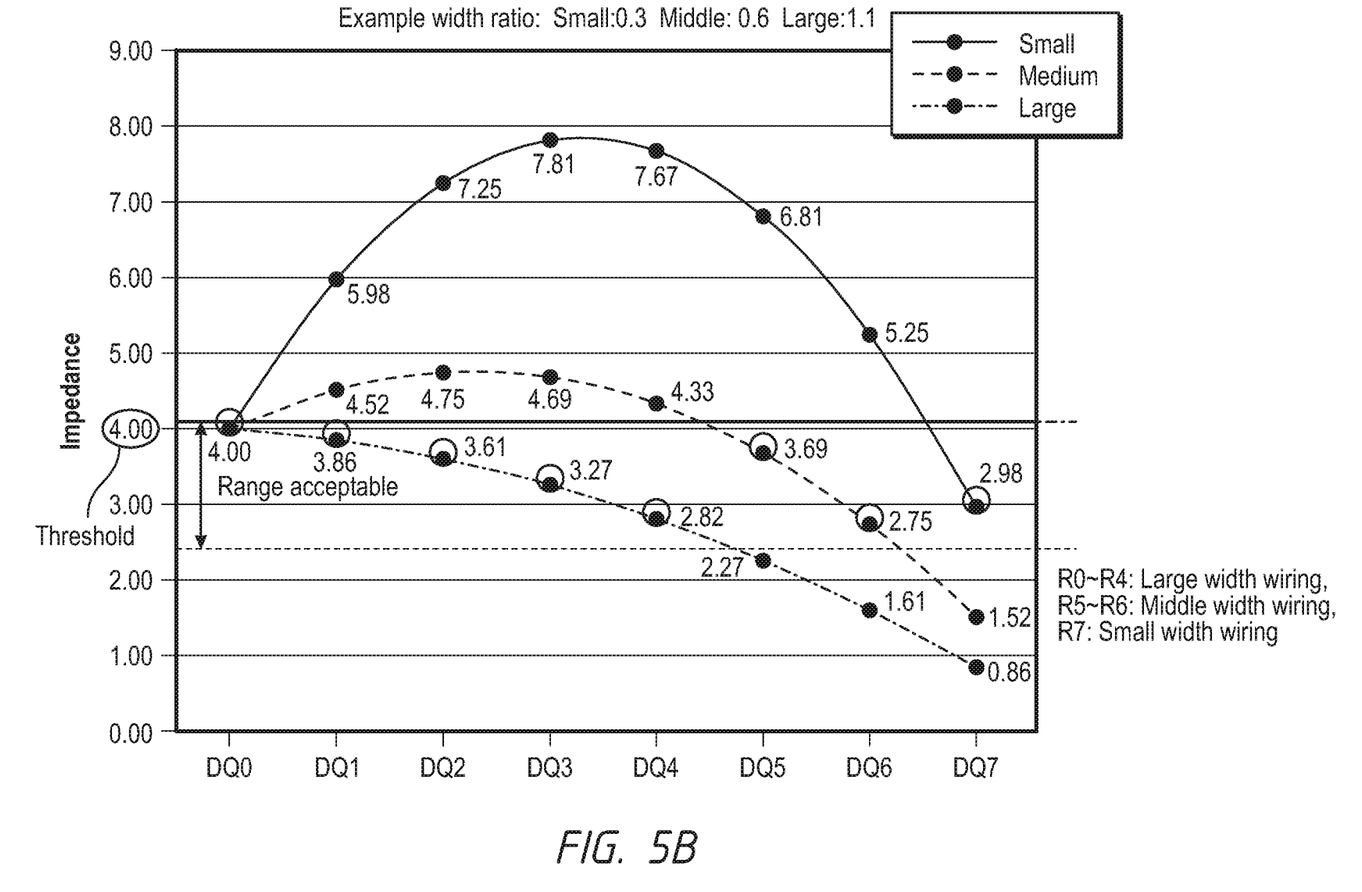
FIG. 5B is a schematic diagram showing an example relationship between distances and impedances for a signal buffer and a plurality of sub data input/output circuits in accordance with an embodiment of the present disclosure.

FIG. 5B is a schematic diagram showing an example relationship between distances and impedances for the signal buffer 84' and the plurality of sub data input/output circuits 500' in accordance with an embodiment of the present disclosure. Width ratios and impedances shown in FIG. 5B are merely examples and different width ratios and impedances may be used without departing from the scope of the present disclosure. The impedance Rs of the sub-wire 831c' is lower than the impedance $R_M$ of the sub-wire 831b' and the impedance $R_M$ of the sub-wire 831b' is lower than the impedance $R_L$ of the sub-wire 831a (Rs<$R_M$<$R_L$), when the first portion 83a', the second portion 83b' and the third portion 83c' may be made from a same material on a same metal layer and having widths "da'", "db'" and "dc'" where "da'" is smaller than "db'" and "db'" is smaller than "dc'". For example, the ratio of the widths between da', db' and dc' may be 1:2:4. In FIG. 5B, the example width ratio among da', db' and dc' is 1:2:4 (0.3, 0.6 and 1.2).

With the above structure, the sub data input/output circuit 500' for DQ7 having a shorter distance to the signal buffer 84' may be coupled to the first portion 83a' at the node 877'. Thus, a higher impedance (2.98, instead of 1.52 and 0.86) may be caused by the first portion 83a' with the smaller width da' between the signal buffer 84' and the node 877'. On the other hand, the sub data input/output circuits 500' for DQ1, DQ2, DQ3 and DQ4 having longer distances to the signal buffer 84' may be coupled to the third portion 83c' at the nodes 871', 872', 873' and 874', respectively. Thus, lower impedances (3.86, 3.61, 3.27, 2.82, that are smaller than 4, instead of relative impedances higher than 4) may be caused by the third portion 83c' with the greater width dc' between the signal buffer 84' and the nodes 871', 872', 873' and 874', respectively. At the same time, the sub data input/output circuits 500' for DQ5 and DQ6 having distances longer than the sub data input/output circuits 500' for DQ7 and shorter than the sub data input/output circuits 500' for DQ4 to the signal buffer 84' may be coupled to the second portion 83b' at the nodes 875' and 876' respectively. Thus, impedances may be controlled in a predetermined range (e.g., 3.69 and 2.75 that are lower than 4 and higher than 2.5) by coupling the sub data input/output circuits 500' for DQ5 and DQ6 to the second portion 83b' with the middle width db' between the signal buffer 84' and the nodes 875' and 876', respectively. Therefore, the impedances between the signal buffer 84' and the plurality of sub data input/output circuits 500' may be kept within a predetermined range (e.g., between 2.5 and 4.0 instead of between 2.98 and 7.81 or between 0.86 and 4.00) and delays corresponding to the impedances as schematically shown in FIGS. 1A and 1C may be controlled within a predetermined range.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
  a signal wire that includes:
    a first straight line extending in a first direction and having a first width in a second direction perpendicular to the first direction; and
    a second straight line extending in the first direction apart from the first straight line and having a second width greater than the first width in the second direction,
  wherein each of the first and second straight lines has a first end and a second end,
  wherein the first end of the first straight line is coupled to the first end of the second straight line, and
  wherein the second end of the first straight line is coupled to the second end of the second straight line.

2. The apparatus of claim 1,
  wherein an impedance of the second straight line from the first end to the second end is lower than an impedance of the first straight line from the first end to the second end.

3. The apparatus of claim 1, further comprising:
  a first wire extending in the second direction and coupled to a first node of the first straight line; and
  a second wire extending in the second direction and coupled to a second node of the second straight line,
  wherein a distance between the first end and the first node of the first straight line is shorter in the first direction than a distance between the first end and the second node of the second straight line.

4. The apparatus of claim 1, further comprising:
  a signal buffer configured to provide the signal to the first ends of the first and second straight lines;
  first and second buffers;
  a first wire extending in the second direction and coupled to the first buffer and a first node of the first straight line; and
  a second wire extending in the second direction and coupled to the second buffer and a second node of the second straight line,
  wherein a length of the first straight line between the signal buffer and the first node of the first straight line is smaller than a length of the second straight line between the signal buffer and the second node of the second straight line.

5. The apparatus of claim 4, wherein the signal is a clock signal.

6. The apparatus of claim 4, wherein the first and second buffers are data buffers.

7. The apparatus of claim 4, wherein the first and second buffers are command/address buffers.

8. An apparatus comprising:
  a clock transmission circuit including a signal wire, the signal wire including:
    a first portion extending in a first direction and having a first end and a second end, and further having a first impedance from the first end to the second end; and
    a second portion extending in the first direction apart from the first portion and having a first end and a second end, and further having a second impedance from the first end to the second end that is lower than the first impedance,
  wherein the signal wire is configured to receive a signal at the first ends of the first and second portions, and
  wherein the second end of the first portion is coupled to the second end of the second portion.

9. The apparatus of claim 8, wherein the signal wire further includes a third portion extending in the first direction and having a first end and a second end, and further having a third impedance from the first end to the second end that is lower than the first impedance and higher than the second impedance,
  wherein the signal wire is further configured to receive the signal at the first end of the third portion, and
  wherein the second end of the third portion is coupled to the second ends of the first and second portion.

10. The apparatus of claim 9, wherein the clock transmission circuit further comprises:

a first wire extending in a second direction perpendicular to the first direction and coupled to a first node of the first portion; and a second wire extending in the second direction and coupled to a second node of the second portion, wherein a fourth impedance between the first end and the first node of the first portion and a fifth impedance between the first end and the second node of the second portion are within a predetermined range.

11. The apparatus of claim 10, wherein a first width of the first portion of the signal wire is smaller than a second width of the second portion of the signal wire, and wherein a first distance between the first node and the first end of the first portion is shorter than a second distance between the second node and the first end of the second portion.

12. The apparatus of claim 11, further comprising a first buffer coupled to the first wire and a second buffer coupled to the second buffer arranged in the first direction;

wherein a distance between the first buffer and the first end of the first wire is shorter than a distance between the second buffer and the first end of the second wire.

13. The apparatus of claim 11, wherein the clock transmission circuit further comprises a third wire extending in the second direction and coupled to a third node of the third portion, wherein a sixth impedance between the first end and the third node of the third portion, the fourth impedance and the fifth impedance are within the predetermined range.

14. The apparatus of claim 13, wherein a third width of the third portion of the signal wire is smaller than the second width and greater than the first width, and wherein a third distance, between the third node and the first end of the third portion is shorter than the second distance and longer than the first distance.

15. An apparatus comprising:

a plurality of circuits arranged in a first direction; and a clock transmission circuit arranged in a second direction perpendicular to the first direction from the plurality of circuits, the clock transmission circuit configured to receive a clock signal and further configured to provide the dock signal to the plurality of circuits;

wherein the clock transmission circuit includes:

a signal wire including:

a first portion extending in a first direction and having a first end and a second end, and further having a first impedance from the first end to the second end; and a second portion extending in the first direction apart from the first portion and having a first end and a second end, and further having a second impedance lower than the first impedance from the first end to the second end, wherein the signal wire is configured to receive a signal at the first ends of the first and the second portion, and wherein the second end of the first portion is coupled to the second end of the second portion.

16. The apparatus of claim 15, wherein the clock transmission circuit further comprises:

a first wire extending in the second direction and coupled to a first node of the first portion; and a second wire extending in the second direction and coupled to a second node of the second portion, wherein a first length between the first node and the first end of the first portion is shorter than a second length between the second node and the first end of the second portion.

17. The apparatus of claim 16, wherein a first width of the first wire is smaller than a second width of the second wire.

18. The apparatus of claim 17, further comprising a signal buffer coupled to the first ends of the first and second portions, the signal buffer configured to receive a clock signal and further configured to provide the clock signal to the first and second portions, wherein the plurality of circuits includes:

a first circuit coupled to the first node; and a second circuit coupled to the second node, and wherein a distance between the first circuit and the signal buffer is shorter than a distance between the second circuit and the signal buffer.

19. The apparatus of claim 18, wherein the plurality of circuits are data buffers.

20. The apparatus of claim 18, wherein the plurality of circuits are command/address buffers.

* * * * *